United States Patent [19]
Morton

[11] Patent Number: 6,162,495
[45] Date of Patent: *Dec. 19, 2000

[54] PROTECTIVE OVERCOAT FOR REPLICATED DIFFRACTION GRATINGS

[75] Inventor: Richard G. Morton, San Diego, Calif.

[73] Assignee: Cymer, Inc., San Diego, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/939,611

[22] Filed: Sep. 29, 1997

[51] Int. Cl.[7] .................................................. C23C 14/24
[52] U.S. Cl. .................... 427/166; 427/250; 427/255.15; 427/255.7; 427/294; 204/192.11; 204/192.26; 204/192.27; 359/572; 359/576
[58] Field of Search ..................................... 427/166, 250, 427/255, 255.7, 294, 255.15; 204/192.11, 192.26, 192.27; 359/572, 576

[56] References Cited

U.S. PATENT DOCUMENTS

| | | | |
|---|---|---|---|
| 4,437,958 | 3/1984 | Rockwood et al. | 204/157.1 |
| 4,803,696 | 2/1989 | Pepper et al. | 372/95 |
| 5,020,879 | 6/1991 | Kuzuta et al. | 350/162.17 |
| 5,080,465 | 1/1992 | Laude | 359/517 |
| 5,431,794 | 7/1995 | Matsumara et al. | 204/192.14 |
| 5,436,764 | 7/1995 | Umetani et al. | 359/566 |
| 5,493,393 | 2/1996 | Beranek et al. | 356/328 |

OTHER PUBLICATIONS

Madden, Robert P., "Preparation and Measurement fo Reflecting Coatings for the Vacuum Ultraviolet", Physics of Thin Films—Advances in Research and Development edited by George Hass, Academic Press, New York and London, 1963 (No Month).

Canfield, L. R., Hass, G. and Waylonis,J. E., "Further Studies on MgF2–Overcoated Aluminum Mirrors with Highest Reflectance in the Vacuum Ultraviolet",Applied Optics, vol. 5, No. 1, Jan., 1966, pp. 45–50.

Hass et al., Journal of the Optical Society of America, vol. 19, No. 6, pp. 593–604, Jun. 1959.

Hass, George and Tousey, Richard, "Reflecting Coatings for the Extreme Ultraviolet", Journal of the Optical Society, vol. 19, No. 6, Jun. 1959, pp. 593–602.

Hass, George, "Reflectance and preparation of front–surface mirrors for use at various angles of incidence from the ultraviolet to the far infrared", vol. 72, No. 1, Jan. 1982, J. Opt. Soc. Am, pp. 27–39.

Hass, George, "Frederic Ives Medalist for 1981", vol. 72, No. 1, Jan. 1982, J. Opt. Soc. Am., pp. 21–26.

Harrison, George R., "The Production of Diffraction Gratings: II. The Design of Echelle Gratings and Spectrographs", Journal of Optical Society of America, Jul. 1949, vol. 39(7), pp. 522–528.

(List continued on next page.)

*Primary Examiner*—Timothy Meeks
*Attorney, Agent, or Firm*—John R. Ross, Esq.

[57] ABSTRACT

An overcoat protected diffraction grating. A replica grating having a thin aluminum reflective grating surface is produced by replication of a master grating or a submaster grating. The thin aluminum reflective surface may be cracked or have relatively thick grain boundaries containing oxides and hydroxides of aluminum and typically is also naturally coated with an aluminum oxide film. The grating is subsequently recoated in a vacuum chamber with a thin, pure, dense aluminum overcoat and then also in the vacuum the aluminum overcoat is coated with a thin film of $MgF_2$. The grating is especially suited for use for wavelength selection in an ArF laser operating producing an ultraviolet laser beam at a wavelength of about 193 nm. The oxygen free aluminum overcoat prevents the ultraviolet light from causing damage by stimulating chemical reactions in grating materials under the aluminum grating surface or in the aluminum oxide film. The $MgF_2$ additionally prevents oxidation on the surface of the aluminum overcoat.

9 Claims, 5 Drawing Sheets

OTHER PUBLICATIONS

Harrison, George R., "The Production of Diffraction Gratings I. Development of the Ruling Art", Journal of the Optical Society of America, Jun. 1949, vol. 39(6), pp. 413–426.

Hutley, M.C., Verrill, J. P., McPhedran, Neviere, M. and Vincent, P., "Presentation and Verification of a Differential Formulation For The Diffraction by Conducting Gratings", Nouvelle Revue d/Optique vol. 6(2), 1975, pp. 87–95 (No Month).

Hutley, M. C., "Diffraction Gratings", 1982, pp. 13–55 and pp. 125–127 (No Month).

Loewen, E. G. and Neviere M., "Dielectric coated gratings: a curious property", Applied Optics, vol. 16(11), Nov. 1977, pp. 3009–3011.

Maystre, D., Laude, J. P., Gacoin, P., Lepere, D. and Priou, J. P., "Gratings for tunable lasers: using multidielectric coatings to improve their efficiency", Applied Optics, vol. 19(18), Sep. 15, 1980, pp. 3099–3102.

Torbin, I. D. and Nizhin, "The use of polymerizing for making replicas of optical surfaces", Soviet Journal of Optical Technology, vol. 40(3), Mar. 1973, pp. 192–196.

PROTECTIVE OVERCOAT FOR REPLICATED DIFFRACTION GRATINGS

FIELD OF THE INVENTION

This invention relates to diffraction gratings and, in particular, to a technique used for extending the life of a diffraction grating.

BACKGROUND OF THE INVENTION

Diffraction gratings are frequently used in lasers for reflecting back into a laser's resonating cavity only a narrow range of wavelengths of light centered at one particular wavelength. Light energy at this wavelength resonates within the cavity and is emitted through a partially reflective mirror at the other end of the cavity. Examples of such diffraction gratings and various methods of making these diffraction gratings are described in U.S. Pat. Nos. 5,080,465; 5,436,764; and 5,493,393, incorporated herein by reference.

Typically, a master diffraction grating is first manufactured. This master grating is then used to form many replica gratings. Each of these replica gratings may then be used as a master grating for forming other replica gratings.

As described in the '465 patent, a master grating may be formed by depositing aluminum over a substrate, such as glass. A diamond tool under interferometric control may then be used to rule very closely spaced grooves in the aluminum layer. The separation of the grooves is related to the wavelength of the light to be reflected by the grating and to the narrowness of the range of wavelengths it is required to reflect. In one embodiment, the diamond tool rules on the order of tens of thousands of grooves per inch. The diffraction grating surface may be ten square inches and the grating one inch thick. Creating a precision master grating by physical ruling is, therefore, an extremely time consuming and expensive process.

Once a master grating has been made, replicas of the grating may be made using techniques such as are described in an article by Torbin and Wiskin in Soviet Journal of Optical Technology, Vol. 40(3) (March, 1973): 192–196. In one such method, a release agent, such as silver, gold, copper glycerine, carnuba wax, debutyphthalate or low vapor pressure oil is coated on the surface of the master. A thin (e.g., 1 micron) reflective layer, such as aluminum, is then deposited onto the release layer. An uncured polyester cement (epoxy) may then be deposited on the aluminum layer, and a glass or metal substrate is then placed on top of the epoxy. After the cement is cured, the glass layer, epoxy layer, and aluminum layer are then separated from the master grating, resulting in a replica of the master grating.

Magnesium fluoride is a known optical coating. Coatings of this material having thicknesses of $\lambda/4$ are used to reduce unwanted reflections. Also $M_gF_2$ coatings have been shown to improve the efficiency of gratings operating at wavelengths greater than about 500 to 600 nm. (See Maystre, et al, Applied Optics, Vol. 19(18) (Sep. 15, 1980): 3099–3102.

One important use of replicated gratings is to line narrow excimer lasers producing ultraviolet light at wavelengths of 248 nm and 193 nm. Applicant has discovered that prior art replica gratings suffer substantial performance degradation when subject to intense ultraviolet radiation especially at the higher energy 193 nm wavelength. What is needed are replica gratings capable of long term high quality performance in intense ultraviolet radiation.

SUMMARY OF THE INVENTION

The present invention provides an overcoat protected diffraction grating. A replica grating having a thin aluminum reflective grating surface is produced by replication of a master grating or a submaster grating. The thin aluminum reflective surface may be cracked or have relatively thick grain boundaries containing oxides and hydroxides of aluminum and typically is also naturally coated with an aluminum oxide film. The grating is subsequently recoated in a vacuum chamber with a thin, pure, dense aluminum overcoat and then also in the vacuum the aluminum overcoat is coated with a thin film of $MgF_2$. The grating is especially suited for use for wavelength selection in an ArF laser operating producing an ultraviolet laser beam at a wavelength of about 193 nm. The oxygen free aluminum overcoat prevents the ultraviolet light from causing damage by stimulating chemical reactions in grating materials under the aluminum grating surface or in the aluminum oxide film. The $MgF_2$ additionally prevents oxidation on the surface of the aluminum overcoat.

DETAILED DESCRIPTION OF PREFERRED EMBODIMENTS

Applicant's Experiments

Applicant has discovered that the aluminum coating deposited during the replication process, typically about 1 micron thick, is subjected to forces during the subsequent take-apart step of the replication process which tend to generate very small fractures in the aluminum coating and may also contain oxides and hydroxides of aluminum in the grain boundaries. These fractures and grain boundary regions allow small quantities of ultraviolet radiation to leak through to the underlying epoxy when the grating is put into service in an excimer laser. The ultraviolet light which reaches the epoxy causes photodecomposition of the epoxy, releasing gases which cause blisters in the overlying aluminum coating. This blistering greatly increases scatter losses from the reflecting facets of the grating. The ultraviolet light also causes bulk shrinkage of the epoxy, which distorts the original groove shape, causing a loss of reflectivity in the desired diffraction order. These effects severely limit the useful lifetime of the grating, causing unavailability of the equipment in which it is used at relatively frequent intervals.

Applicant has been able to partially solve the problem caused by the cracks in the original aluminum layer of the replica grating by depositing another thin reflective overcoat of aluminum of about 100 nm on the surface of the replica after the replica has been removed from the master and cleaned. The overcoating is preformed in a vacuum chamber by sputtering or evaporation. This overcoat produced a major improvement in the grating performance especially when used for wavelength selection in a KrF excimer laser operating at a wavelength of about 248 nm. However, Applicant has discovered that even with the aluminum overcoat substantial performance degradation occurred when the grating is used for wavelength selection in an ArF excimer laser operating at a wavelength of about 193 nm. Applicant believes the degradation is due to quantum photochemical and photophysical mechanisms involving high energy UV photon interaction with oxygen in the aluminum film as deposited; or at the boundary of the oxide layer which naturally forms on aluminum surfaces when those surfaces are exposed to air after the aluminum coating has been deposited on the grating. This degradation can be accentuated if the UV radiation of the aluminum surface takes place in an environment containing oxygen such as air. However, even if the space over the aluminum surface is purged with nitrogen during periods of UV illumination, reactions with oxygen in $Al_2O_3$ surface films or in the grain boundary regions can degrade performance.

FIRST PREFERRED EMBODIMENT

Figure 1:
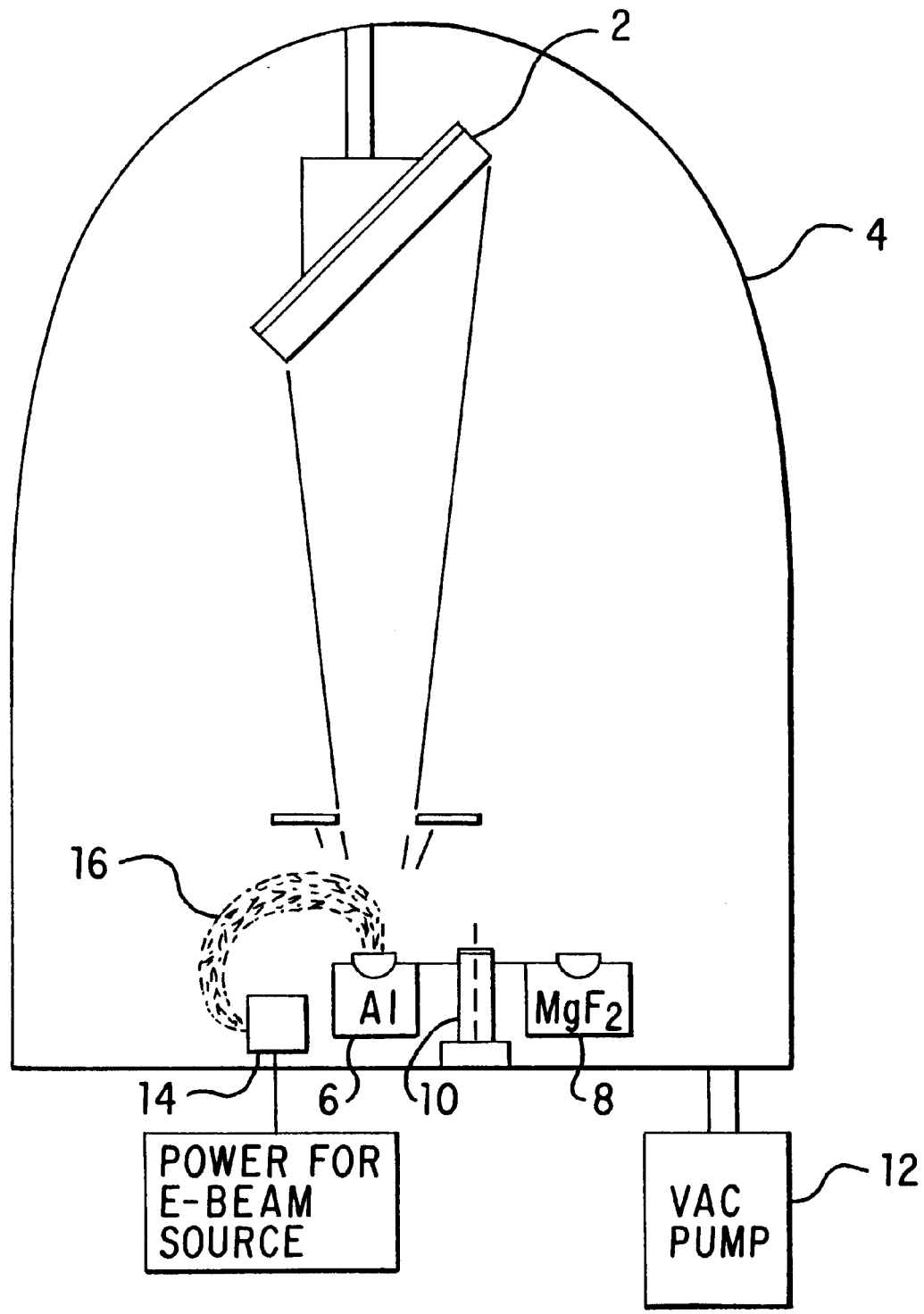
FIG. 1 is a drawing of a vacuum deposition chamber.

A first preferred embodiment of the present invention can be described by reference to FIG. 1. This figure describes a method of coating a prior art grating to provide a grating suitable to long term use in high intensity ultraviolet environments.

Figure 2:
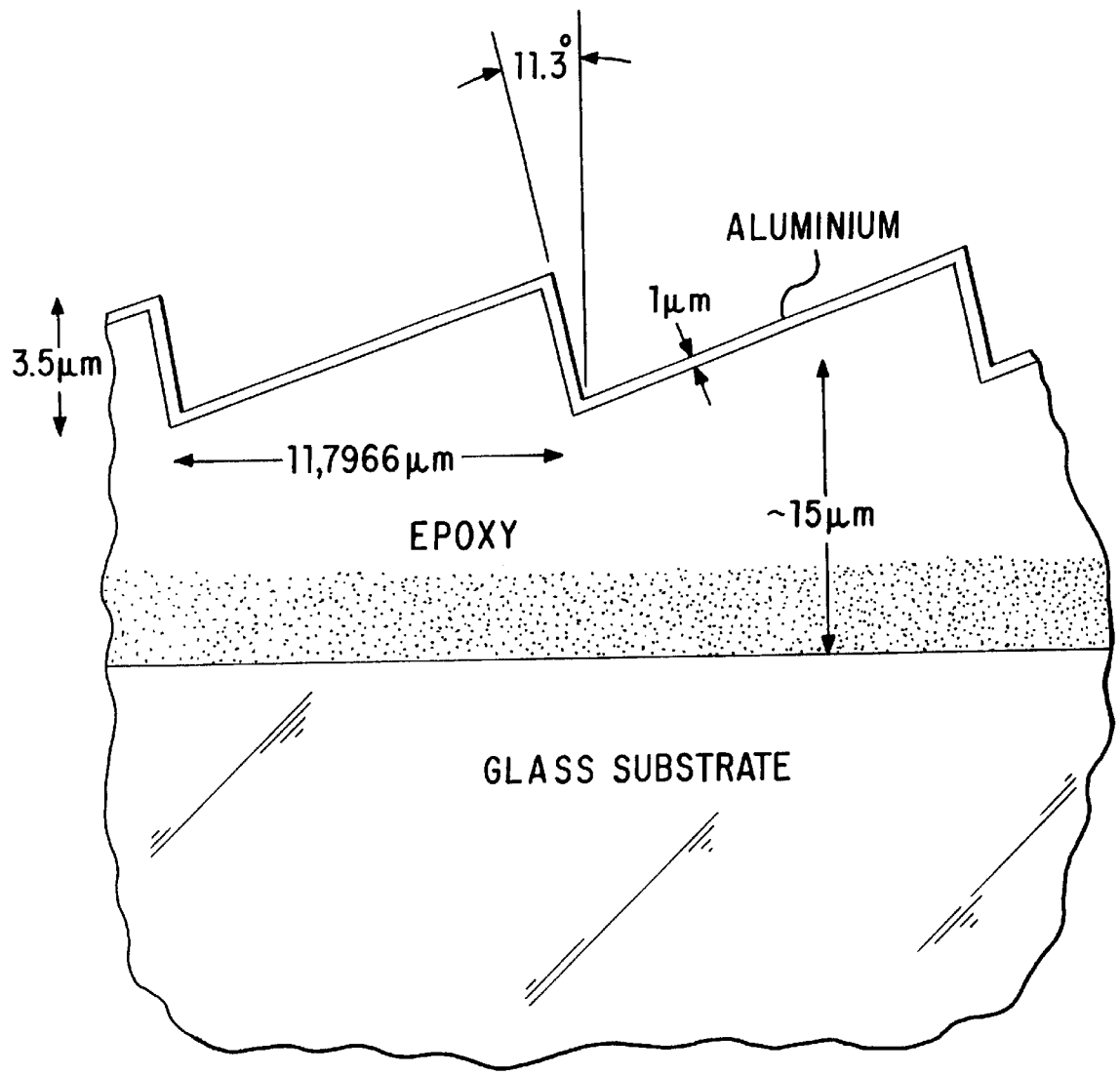
FIG. 2 is a drawing of a section of a prior art replica grating.

Applicant has performed coating operations with a prior art grating having dimensions of about 250 mm in length, 35 mm thick and 35 mm wide. The grooves of this grating are spaced at about 84.77 grooves per mm. FIG. 2 is a drawing of a section of the grating surface. The grating substrate 40 is glass covered by an epoxy layer 42 which is about 15 microns thick which is covered by 1 micron aluminum layer 44. The grooves are spaced at intervals of 11.7966 microns and are triangular shaped and about 3.5 microns deep at the deep end of each groove. The 3.5 micron face of the groove makes a 11.3° angle with the normal to the face of the grating. When used in a Littrow configuration for wavelength selection in a laser, the grating is tilted at 11.3 degrees to the incoming beam so that the incoming beam meets the short surface at 90 degrees. The 3.5 micron face is the reflective face. In an ArF laser operating at a wavelength of 193.38 nm, twice the distance between successive short faces is exactly equivalent to 122 wavelengths of the 193.38 nm ArF light. Twice the distance between the short faces is also exactly equivalent to 95 wavelengths of KrF light at 248.35 nm. Therefore, the same grating can be used for wavelength selection of either KrF lasers or ArF lasers.

Prior art replicated grating 2 is mounted in physical vapor deposition vacuum chamber 4 above vapor sources of aluminum metal and magnesium fluoride. Aluminum is contained in an aluminum crucible 6 and magnesium fluoride is contained in a magnesium fluoride crucible 8 both of which are mounted on a rotating support 10 which may be rotated so as to provide a first coating of aluminum and a second coating of $MgF_2$. Vacuum pump 12 provides a vacuum pressure of $10^{-6}$ torr or less, which is sufficient to assure a mean free path several times longer than the distance between the source and the grating. This provides essentially collision free atomic and molecular deposition. Also, at this pressure the collision rate of background gases, such as oxygen or hydrogen, with the surface to be coated is substantially less than the arrival rate of aluminum atoms or magnesium fluoride molecules. This results in the deposition of pure, dense aluminum and magnesium fluoride on the grating surface. There is therefore no oxygen or hydrogen present within the bulk coating materials. The sources are heated with an electron beam 16 from an electron beam source 14 in the conventional manner, the beam being bent to the crucible location with a magnetic field from a magnetic source (not shown).

Figure 3:
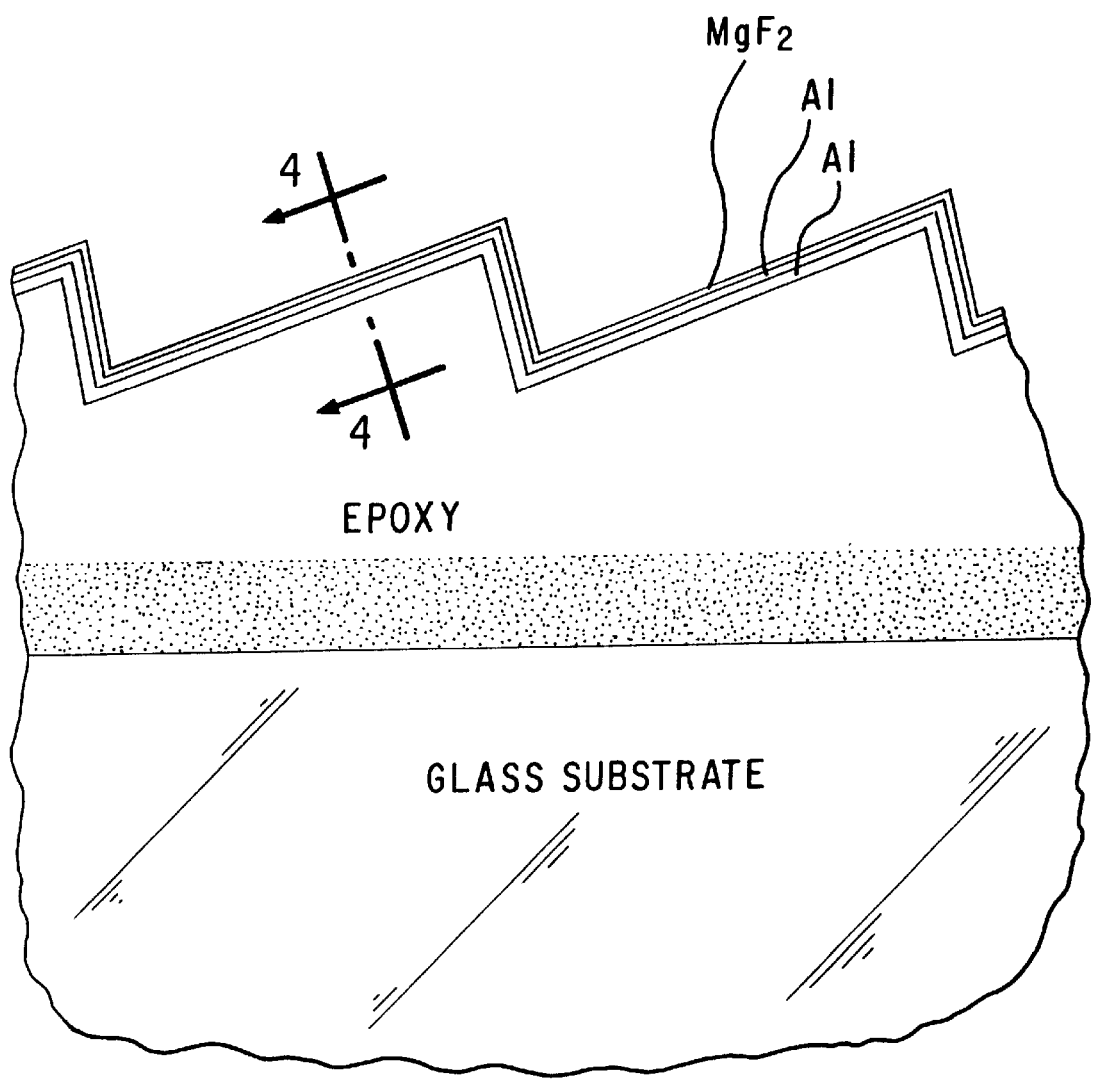
FIG. 3 is a drawing of the same section as shown in FIG. 2 with an overcoat according to an embodiment of the present invention.
Figure 4:
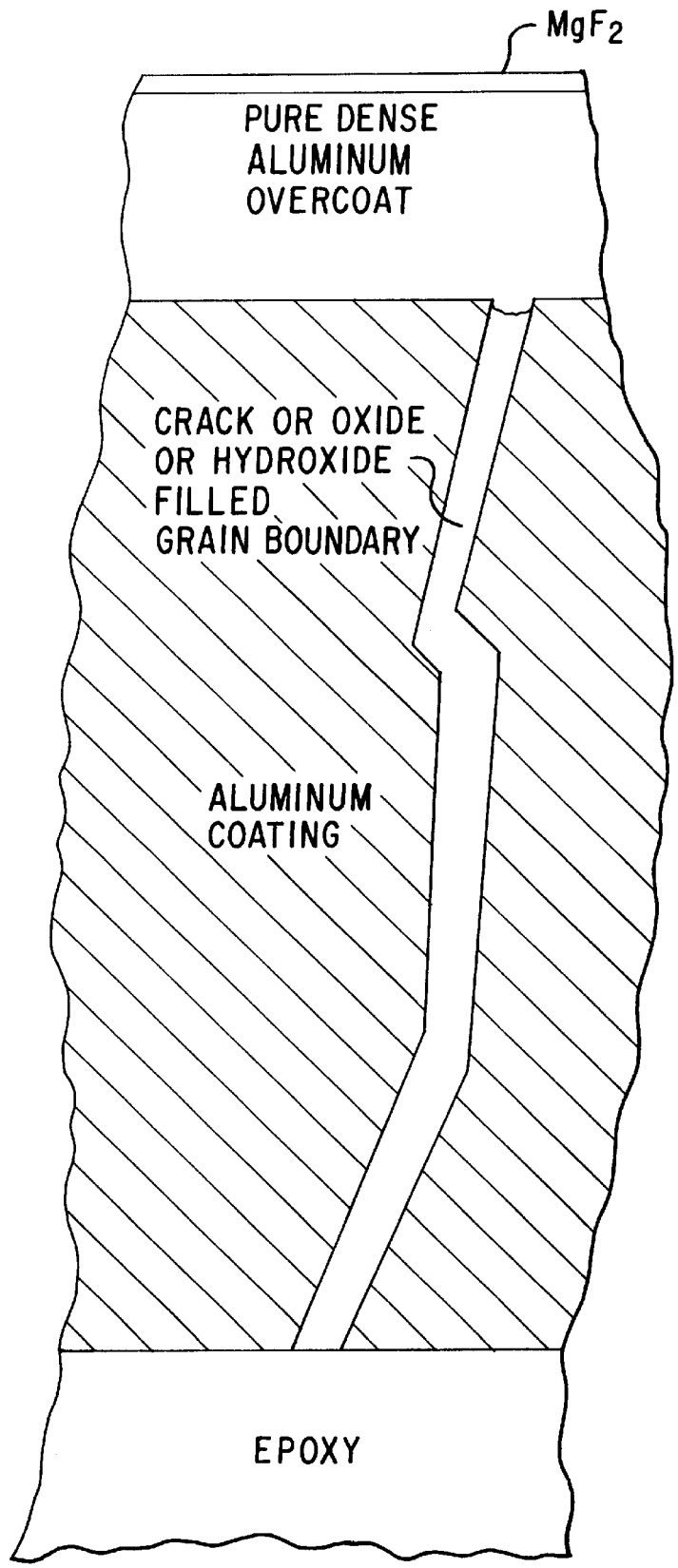
FIG. 4 is a drawing highly enlarged of a section of the section shown in FIG. 3.

To provide the secondary aluminum coating and the $MgF_2$ overcoating, grating 2 is mounted in vacuum chamber 4 at an angle of such that the coating atoms strike the grating surface at an angle of about 50 degrees to the normal. This means that the atoms are impinging on the short surface at an angle of 66 degrees and the long surface at an angle of about 45 degrees. The coating process should continue until a dense aluminum thickness of about 100 nm is achieved. Without breaking the vacuum in the chamber 4, the support 10 is used to rotate the $MgF_2$ source in place and an overcoat of $MgF_2$ of about 10 nm is placed over the aluminum coating on the short surface of the grating. The thicknesses of both coatings on the long surface will be about 75% of the corresponding thickness on the short surface. The result of the double coating is shown in FIGS. 3 and 4.

Test Results

Gratings overcoated in accordance with the present invention have been tested by Applicant in wavelength selecting modules on an ArF laser and compared to prior art non-densely unovercoated gratings.

Figure 5:
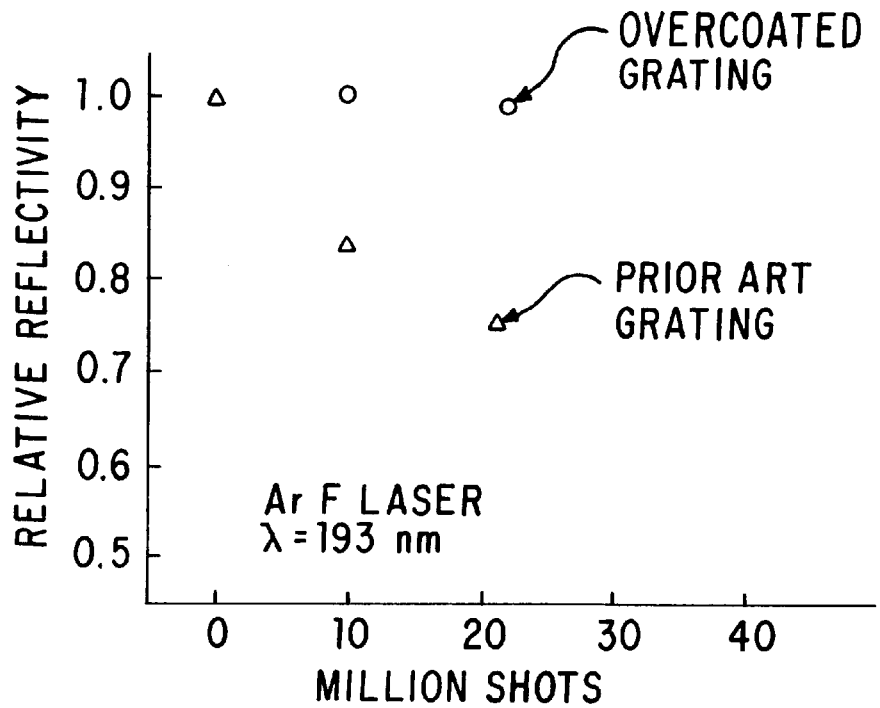
FIG. 5 is a graph of test data showing a performance comparison of an overcoated grating with a prior art grating.

Data from the ArF experiment is shown in FIG. 5. After about 20 million pulses at 10 mJ per pulse at 193 nm the prior art grating has decreased in reflectivity to about 75% of its initial value; whereas the grating overcoated in accordance with the present invention still provides a reflectivity of more than 95% of its initial value.

Importance of Dense Non-Oxidized Al Overcoat

Figure 6:
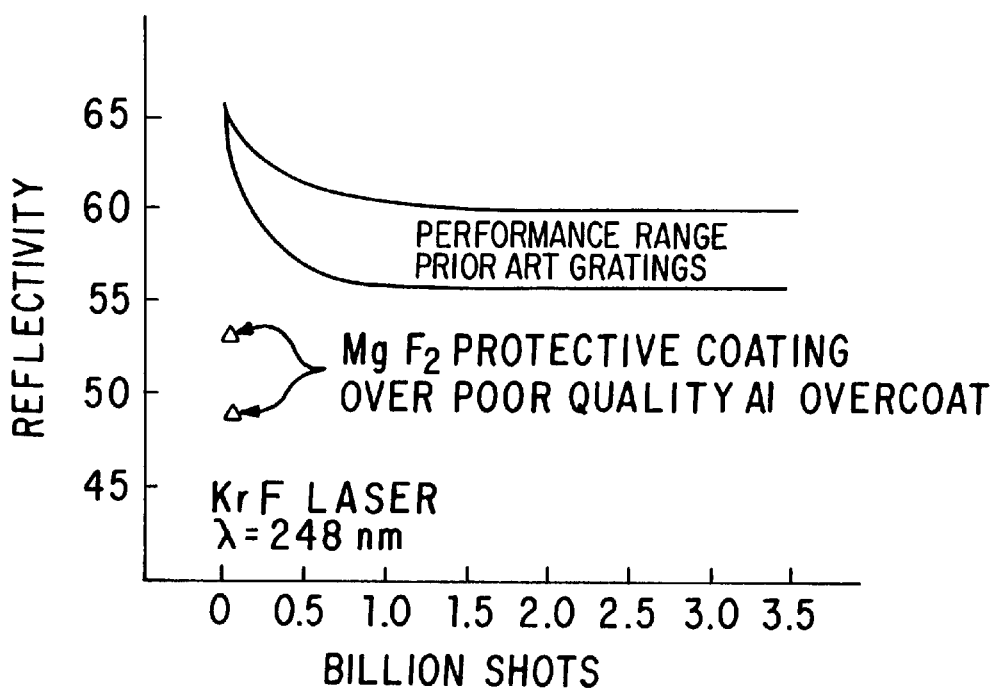
FIG. 6 is a graph showing unsatisfactory performance of a prior art grating overcoated with non-dense aluminum an then $MgF_2$.

It is important that the aluminum overcoating be a pure dense coat of aluminum and that the coating is free of oxidation. Merely coating the original cracked and/or non-dense coating on the prior art grating with $MgF_2$ provides no substantial improvement. In fact, preliminary experiments by Applicant in a 248 nm environment showed poor initial performance and rapid degradation of a grating having a $MgF_2$ coating but with an aluminum overcoat applied at a vacuum pressure higher than $10^{-5}$ torr, see FIG. 6. It is also important as stated above to put the $MgF_2$ coating on the aluminum overcoat before there is any significant oxidation of the aluminum overcoat. If there is an oxide film on the aluminum, the UV will cause chemical changes below the $MgF_2$ layer and distort the grating surface, thus reducing reflectivity. It should be noted that the requirement for a pure dense aluminum coat is not normally important when the grating is used in environments where the UV intensity is low such as in astronomy work. The pure dense aluminum coating, however, is very important at high UV levels such as those produced by excimer lasers.

While particular embodiments of the present invention have been shown and described, it will be obvious to those skilled in the art that changes and modifications may be made without departing from this invention in its broader aspects. For example, persons skilled in the art will understand that methods other than sputtering could be used to produce an oxide-free, dense aluminum overcoat. The thickness of the aluminum overcoat and the $MgF_2$ protective coat can be varied somewhat. Preferred thicknesses for the aluminum coat are from about 50 nm to about 200 nm and for the $MgF_2$ protective coat the preferred thicknesses are about less than 50 nm. However, thicknesses outside these ranges may be specified. It is most important that good coatings be applied to the surface which will be exposed to the intense ultraviolet light. For the grating shown in FIGS. 2 and 3, that surface is the short 3.5 micron surface. The test results discussed above were obtained using a wavelength selecting module containing a three-prism beam expander, and a beam angle adjusting mirror along with the overcoat material diffraction grating arranged in a Littrow configuration. However, persons skilled in the art will recognize many other applications for gratings fabricated according to the present invention. Therefore, the appended claims are to encompass within their scope all such changes and modifications as fall within the true spirit and scope of this invention.

What is claimed is:

1. A process for line narrowing a laser beam of an ultraviolet laser comprising:

A) preparing a replica grating having a lined surface defining a lined surface plane having a large number of grooves, each groove having a triangular shaped cross section defined by a short surface and an adjacent long surface, said short surfaces being disposed relative to the lined surface plane to selectively reflect, in a predetermined direction, light at at least one narrow band of ultraviolet wavelengths within a wavelength range between about 193 nm to about 248 nm;

B) placing said replica grating in a vacuum chamber and reducing the chamber pressure to below $10^{-6}$ torr;

C) while maintaining the chamber pressure below $10^{-6}$ torr, depositing on each of said short surfaces an overcoat layer of aluminum having a thickness of about 50 nm to 200 nm;

D) while maintaining the chamber pressure below $10^{-6}$ torr, depositing on said overcoat layer of aluminum on each of said short surfaces, a protective layer of $MgF_2$ at a thickness of less than about 25 nm; and E) installing the grating on an ultraviolet laser capable of lasing at wavelengths within the range of about 193 nm to about 248 nm in order to line narrow the laser beam wherein said replica grating is placed in said chamber so that said overcoat layer is deposited more thickly on said short surfaces than on said long surfaces.

2. The process of claim 1 wherein said $MgF_2$ layer on at least one set of said surfaces is about 10 nm thick and said aluminum layer is about 100 nm thick.

3. The process as in claim 1 wherein said chamber pressure is below $5 \times 10^{-7}$ torr.

4. The process as in claim 1 wherein the chamber pressure is continuously maintained below $10^{-6}$ torr during steps C and D.

5. The process as in claim 4 wherein both of said depositing steps are accomplished using an electron beam sputtering technique.

6. The process as in claim 4 wherein both of said depositing steps are accomplished using a vapor deposition technique.

7. A process as in claim 1 wherein said at least one very narrow band of ultraviolet wavelengths is at least two very narrow band of wavelengths, one centered at about 193 nm and another centered at about 248 nm.

8. A process as in claim 1 wherein said grooves are spaced apart by about 11.7966 microns.

9. A process as in claim 1 wherein said replica grating is placed in said vacuum chamber in a position such that most aluminum atoms which are deposited on said grating, and most $MgF_2$ molecules which are deposited on said overcoat layer strike the short surfaces at a larger angle than the angle at which they strike the long surfaces thereby depositing aluminum and $MgF_2$ layers more thickly on the short surfaces than on the long surfaces.

* * * * *